(12) United States Patent
Kaczynski

(10) Patent No.: US 6,919,658 B2
(45) Date of Patent: Jul. 19, 2005

(54) COORDINATE MEASURING STAGE

(75) Inventor: Ulrich Kaczynski, Bad Nauheim (DE)

(73) Assignee: Leica Microsystems Semiconductor GmbH, Wetzlar (DE)

( * ) Notice: Subject to any disclaimer, the term of this patent is extended or adjusted under 35 U.S.C. 154(b) by 163 days.

(21) Appl. No.: 10/633,222

(22) Filed: Aug. 1, 2003

(65) Prior Publication Data

US 2004/0027008 A1 Feb. 12, 2004

(30) Foreign Application Priority Data

Aug. 7, 2002 (DE) .......................................... 102 36 239

(51) Int. Cl.[7] .............................................. F16H 13/00
(52) U.S. Cl. ............................ 310/80; 476/64; 476/66; 74/112
(58) Field of Search ............................... 74/112–125.5; 476/64, 67; 310/20, 80

(56) References Cited

U.S. PATENT DOCUMENTS

| | | | | |
|---|---|---|---|---|
| 4,444,069 | A | * | 4/1984 | Dangschat .................... 476/11 |
| 6,178,836 | B1 | * | 1/2001 | Miyake et al. ................. 74/89 |
| 6,840,886 | B2 | * | 1/2005 | Ohara .......................... 476/67 |
| 2003/0053037 | A1 | | 3/2003 | Blaesing-Bangert et al. .. 355/53 |

FOREIGN PATENT DOCUMENTS

DE 10140174 3/2003 ............ G12B/5/00

OTHER PUBLICATIONS

K.–D. Röth und K. Rinn, "Maskenmetrologie mit der LEICA LMS IPRO für die Halbleiter–Produktion", Leica Mikroskopie und Systeme GmbH, Wetzlar (Translation—see Application Text).

* cited by examiner

*Primary Examiner*—Darren Schuberg
*Assistant Examiner*—Judson H. Jones
(74) *Attorney, Agent, or Firm*—Davidson, Davidson & Kappel, LLC

(57) ABSTRACT

An XY coordinate measuring stage includes a drive unit for a coordinate axis. The drive unit has a friction rod and a motor, the motor including a motor shaft in contact with a side of the friction rod. An applied pressure roller contacts an opposite side of the friction rod. At least one applied pressure spring urges the applied pressure roller, the friction rod, and the motor shaft against one another with an applied pressure force so that the motor shaft frictionally engages the friction rod, converting a rotational motion of the motor into a linear motion of the friction rod. A compensation device associated with the motor shaft generates a compensation force onto the motor shaft oppositely to the applied pressure force so as to at least partially compensate for the applied pressure force.

8 Claims, 4 Drawing Sheets

COORDINATE MEASURING STAGE

This application claims priority to German patent application 102 36 239.4, the subject matter of which is hereby incorporated by reference herein.

The invention relates in general to coordinate measuring stages having a friction rod and a motor for each coordinate axis, and in particular to a coordinate measuring stage with a motor shaft having a compensation device.

BACKGROUND

Coordinate measuring stages having a friction rod and a motor for each coordinate axis are used in high-accuracy coordinate measuring instruments for measuring substrates in the semiconductor industry. A coordinate measuring instrument having such a coordinate measuring stage is described in the article "Maskenmetrologie mit der LEICA IMS IPRO für die Halbleiterproduktion" [Mask metrology using the LEICA IMS IPRO for semiconductor production] by K.-D. Röth and K. Rinn, Mitteilungen für Wissenschaft und Technik Vol. XI, No. 5, pp. 130–135, October 1997. This measuring instrument is used for high-accuracy measurement of the coordinates of the edges of a pattern element on a substrate, e.g. a mask and a wafer.

The previously unpublished document DE 101 40 174.4-52 describes an additionally improved coordinate measuring stage of the aforesaid kind, and a coordinate measuring instrument for high-accuracy measurement of the coordinates of the edges of a pattern element on a substrate, e.g. a mask and a wafer.

The coordinate measuring instrument has a coordinate measuring stage of the aforesaid kind that is displaceable horizontally in the X direction and the Y direction. It serves to receive a substrate having features whose edge coordinates are to be measured. In addition, a separate interferometer measurement beam path is associated with each coordinate axis (X, Y) of the measuring stage. Measurement mirrors, which are located at the ends of the two interferometer measurement beam paths, are mounted on two mutually perpendicular sides of the measuring stage. By means of the two measurement mirrors, the position of the measuring stage can be determined interferometrically.

The coordinate measuring stage has, for each coordinate axis, a drive unit having a friction bar and a motor. The motor is in contact with its motor shaft against the one end of the friction bar, while an applied pressure roller is in contact against the other end of the friction bar. At least one spring is provided which preloads the applied pressure roller, friction bar, and motor shaft against one another by means of an applied pressure force. The result of this is that the motor shaft engages frictionally against the friction bar, so that the rotational motion of the motor is converted into a linear motion of the friction bar.

Coordinate measuring instruments of the aforementioned kind serve to determine coordinates with a reproducibility in the range of less than 5 nm. Since this measurement accuracy, as already mentioned, depends very substantially on the XY positioning accuracy and vertical running accuracy of the measuring stage, the design of the measuring stage is subject to extremely stringent requirements.

The motors used in the drive units of the known coordinate measuring stages had a rotation-speed-dependent torque. Since the known coordinate measuring stages also already comprised heavy stage components, the motors therefore always needed to be operated at high revolutions in order to generate high torque. In order additionally to achieve good fine-scale positioning in the range below 30 nm with the known coordinate measuring stages, the rotational motion of the rapidly rotating motor shaft therefore had to be greatly reduced using a linkage.

Stepping motors or DC motors, for example, having a friction wheel placed on the motor shaft that acted on the friction bar through a friction wheel reduction linkage, were used for this purpose in the drive units. To ensure sufficient frictional engagement between the last friction wheel and the friction bar, the applied pressure force must be made correspondingly high. The necessary applied pressure force also depends on the mass that needs to be displaced by the drive system.

In the context of a new development of a coordinate measuring machine, a very large XY coordinate measuring stage was required, allowing the mensuration of large substrates in the semiconductor industry, for example 9" masks and 300 mm wafers. As a result of this, the individual movable stage components (for the X and Y directions) were substantially heavier (up to 80 kg) than in previous coordinate measuring stages. Experiments with this very large XY coordinate measuring stage using the known drive units showed that the known drives did not apply enough torque to move these masses. Because of the large masses to be moved, some of the frictional engagement on the friction bar was lost, i.e. slippage occurred. This resulted, however, in a definite loss of positioning accuracy.

SUMMARY OF THE INVENTION

It is therefore an object of the present invention to provide a very large XY coordinate measuring stage that permitted precise XY positioning accuracy despite the large stage mass.

The present invention provides an XY coordinate measuring stage (1) that has for each coordinate axis a drive unit having a friction rod (10; 12) and a motor (9; 11), the motor (9; 11) with its motor shaft (19) being in contact against the one side of the friction rod (10; 12), and an applied pressure roller against the other side of the friction rod (10; 12). At least one applied pressure spring (24) is provided which preloads the applied pressure roller (20), the friction rod (10; 12), and the motor shaft (19) against one another with an applied pressure force, as a result of which the motor shaft (19) engages frictionally against the friction rod (10; 12) and converts the rotational motion of the motor (9; 11) into a linear motion of the friction rod (10; 12). The motor shaft (19) has associated with it a compensation means (21) that generates a compensation force, directed oppositely to the applied pressure force, which is directed onto the motor shaft (19) and compensates for the applied pressure force.

With the known coordinate measuring stage, the applied pressure roller, the friction bar, and the motor shaft were preloaded against one another with the applied pressure force of at least one spring, so that the motor shaft engages frictionally against the friction bar. It has been found that with the new very heavy coordinate measuring stage, a substantially greater applied pressure force was necessary in order to press the friction wheel against the friction bar, but this placed an extreme load on the bearings of the motor shaft.

In order further to increase the applied pressure force for moving the extremely heavy stage components of the new coordinate measuring stage, according to the present invention the drive unit therefore has associated with it compensation means that generate a compensation force, directed oppositely to the applied pressure force, which is directed onto the motor shaft and compensates for the applied pressure force. This makes possible a distinct increase in the applied pressure force without excessive load on the bearings of the motor shaft.

In an embodiment of the invention, the compensation means encompasses two closely adjacent load-relief bearings on a limitedly movable load relief bearing retaining element, the load-relief bearings being preloaded with a compensation force against the motor shaft of the motor. The gap between the two load-relief bearings forms a V-shaped receptacle for the motor shaft which centers itself against the motor shaft because of the applied pressure force and the movability of the load relief bearing retaining element.

The load-relief bearings and the applied pressure roller can be embodied as ball bearings or self-aligning ball bearings or needle bearings. Stepping motors can be used as drive elements.

The use of torque motors has proven particularly advantageous, however, since these make available their entire, very high torque over even the smallest displacement travels. This proves to be a great advantage when moving the heavy stage components. With this embodiment it was in fact possible to improve positioning accuracy even further. It proves in this context to be additionally advantageous that no further linkages of any kind, with the mechanical tolerances associated therewith, are necessary. Since energy transfer occurs directly from the motor shaft onto the friction bar, the positioning accuracy is affected essentially only by the actuation accuracy of the motor.

BRIEF DESCRIPTION OF THE DRAWINGS

The invention will be elaborated upon below based on an exemplary embodiment with reference to the schematic drawings, in which.

DETAILED DESCRIPTION

Figure 1:
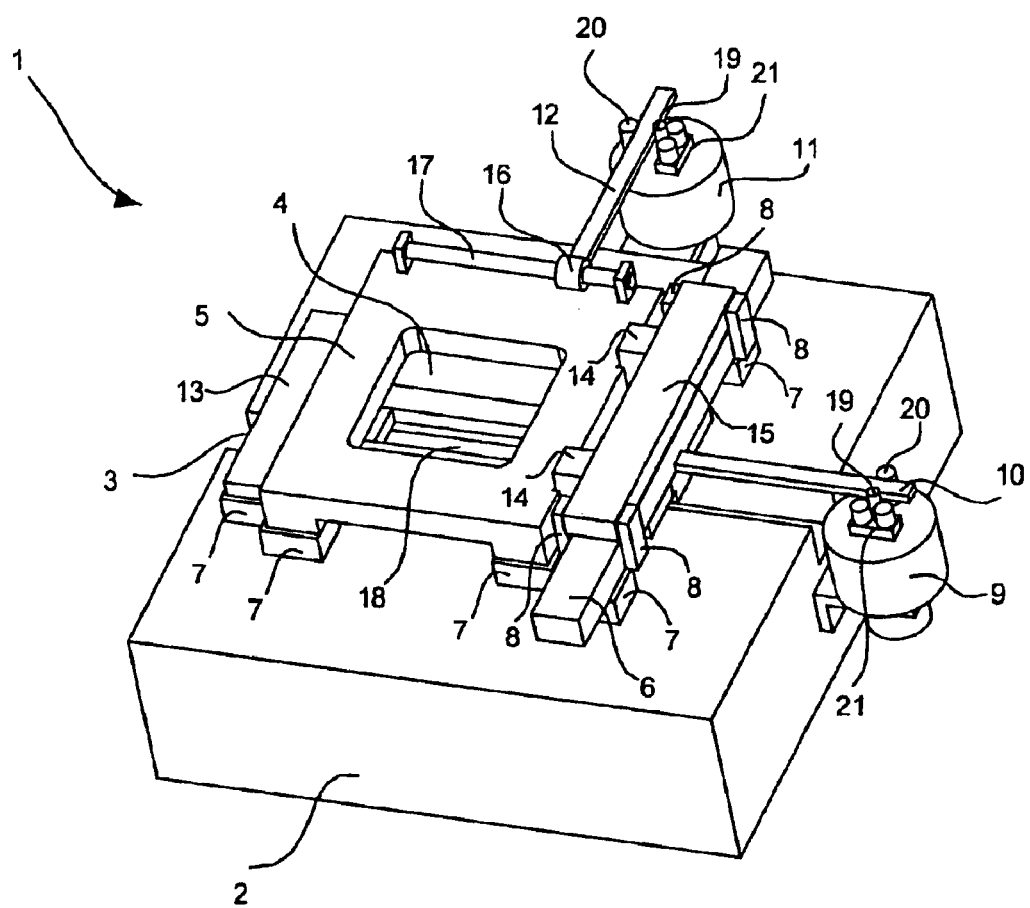
FIG. 1 is a perspective view of a coordinate measuring stage according to the present invention.

FIG. 1 is a perspective view of a completely assembled coordinate measuring stage 1 according to the present invention. A base part 2 is depicted, with a middle part 4 arranged thereabove. Middle part 4 is suspended on a Y guidance element 6 and an additional support element 13, both of which are supported by means of support air bearings 7 on the plane surface of base part 2, and are slidingly displaceable thereon. For displacement of middle part 4 in the X direction, base part 2 has an X guidance element 3 embodied as a groove. Guidance air bearings 8 arranged on middle part 4, which engage into X guidance element 3 in order to guide motion in the X direction, are concealed in this depiction.

In order to achieve the X motion, middle part 4 is joined to an X friction bar 10 which transfers the rotational motion of an X drive element 9 to middle part 4. Opposite a motor shaft 19 of X drive element 9, an applied pressure roller 20 is arranged frictionally against X friction bar 10. For that purpose, applied pressure roller 20, X friction bar 10, and motor shaft 19 are preloaded against one another with an applied pressure force of at least one spring (not depicted), so that motor shaft 19 engages frictionally against the X friction bar.

Motor shaft 19 of X drive element 9 has associated with it, according to the present invention, a compensation means 21 that generates a compensation force, directed oppositely to the applied pressure force, which is directed onto motor shaft 19 and compensates for the applied pressure force. This makes possible a distinct increase in the applied pressure force without excessively loading the bearings of motor shaft 19.

Stage body 5, which spans well beyond middle part 4, is arranged above middle part 4. Stage body 5 is also supported on the surface of base part 2 by means of several support air bearings 7, and is slidingly displaceable in the Y direction along a Y guidance element 6. Since this Y guidance element 6 carries middle part 4 which is movable in the X direction, stage body 5 follows in constrainedly guided fashion every motion of middle part 4 in the X direction.

Two retaining elements 14, on which a Y guide rib 15 is mounted, are arranged on the outer side of stage body 5 facing toward Y guidance element 6. Arranged on the outer side of Y guide rib 15 are several guidance air bearings 8 which are mounted against the outer side of Y guidance element 6 and ensure precise motion of stage body 5 along Y guidance element 6. In order to achieve the Y motion, a Y drive element 11, whose rotational motion is transferred by a Y friction rod 12 onto stage body 5, is arranged in stationary fashion on base part 2.

Y friction rod 12 engages at its one end, with an annular air bearing 16, against a push bar 17 extending in the X direction, and thereby transfers the Y motion of Y friction rod 12 onto stage body 5. An applied pressure roller 20 is arranged frictionally on Y friction rod 12 opposite motor shaft 19. For that purpose, applied pressure roller 20, Y friction rod 12, and motor shaft 19 are preloaded against one another with the applied pressure force of at least one spring (not depicted), so that motor shaft 19 engages frictionally against Y friction rod 12.

Motor shaft 19 of Y drive element 11 has associated with it, according to the present invention, a compensation means 21 that generates a compensation force, directed oppositely to the applied pressure force, which is directed onto motor shaft 19 and compensates for the applied pressure force. This makes possible a distinct increase in the applied pressure force without excessively loading the bearings of motor shaft 19.

Base part 2, middle part 4, and stage body 5 have respective internally located openings 18, lying one above another, which create an open transmitted-light region for transmitted-light measurements.

Figure 2:
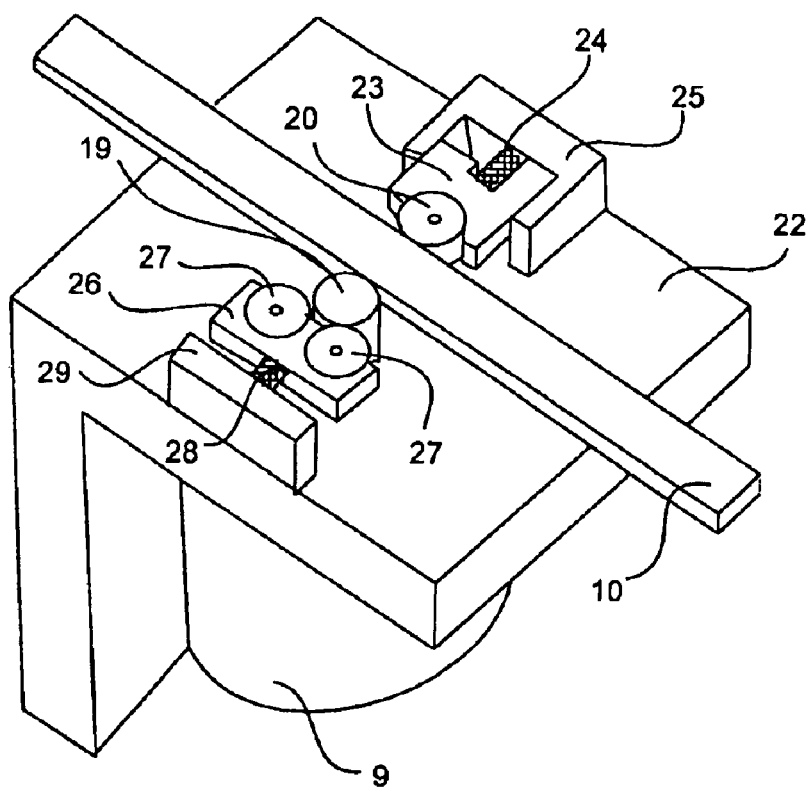
FIG. 2 is detail view, in perspective, of the X drive of the coordinate measuring stage of FIG. 1.

FIG. 2 is a perspective detail view of the X drive of the coordinate measuring stage of FIG. 1.

An X drive element 9 is arranged on a motor mount 22. Motor shaft 19 of X drive element 9 projects upward through motor mount 22, and is in contact against an X friction rod 10. On the other side of X friction rod 10, directly opposite motor shaft 19, an applied pressure roller 20 is arranged on an applied pressure roller retaining element 23. An applied pressure spring 24 is arranged on an applied pressure spring retaining element 25 and preloads applied pressure roller retaining element 23 against applied pressure roller 20, and thus applied pressure roller 20 itself against X friction rod 10 with an applied pressure force.

On the motor shaft 19 side, two closely adjacent load relief bearings 27 are arranged on a load relief bearing retaining element 26. Load relief bearing retaining element 26 is limitedly movable with respect to motor mount 22. A compensation spring 28 is arranged on a compensation spring retaining element 29, and preloads the two load relief bearings 27 on load relief bearing retaining element 26 against motor shaft 19 with a compensation force.

This compensation force is directed oppositely to the applied pressure force exerted by applied pressure roller 20, and compensates for the applied pressure force. The load on motor shaft 19 is thereby relieved. At the same time, it is possible to act on X friction rod 10 with very high applied pressure forces and thereby to move the very heavy components of the coordinate measuring stage. The gap between the two load relief bearings 26 forms a V-shaped receptacle for motor shaft 19, which is centered against motor shaft 19 by the movability of load relief bearing retaining element 26 and by the applied pressure force itself.

Figure 3:
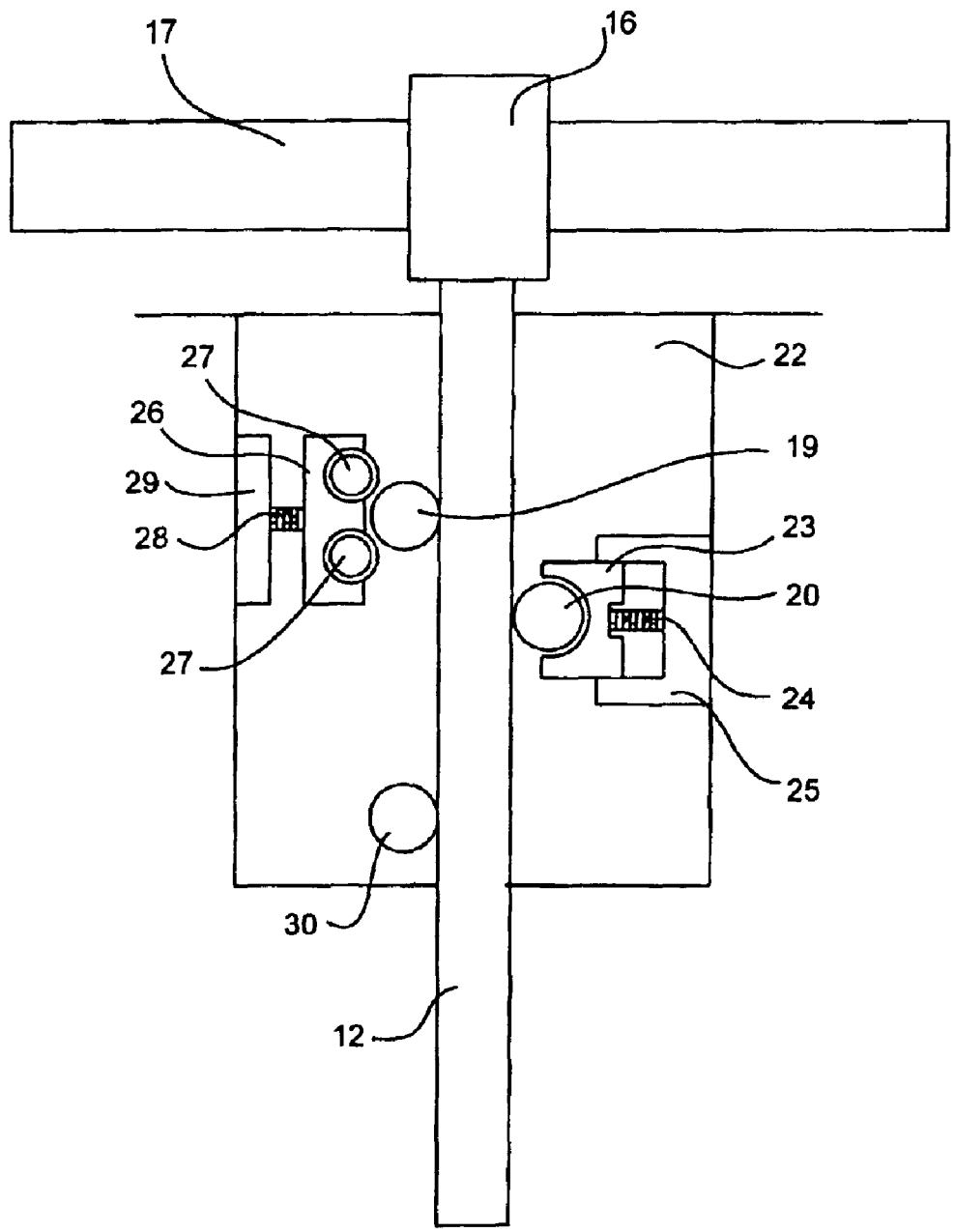
FIG. 3 is a detail view, from above, of the Y drive of the coordinate measuring stage of FIG. 1.

FIG. 3 is a detail view, from above, of the Y drive of the coordinate measuring stage of FIG. 1.

A Y drive element 11 (concealed in the illustration) is arranged on a motor mount 22. Motor shaft 19 of Y drive element 11 projects upward through motor mount 22 and is in contact against a Y friction rod 12.

On the other side of Y friction rod 12, with a lateral offset with respect to motor shaft 19, an applied pressure roller 20 is arranged on an applied pressure roller retaining element 23. An applied pressure spring 24 is arranged on an applied pressure spring retaining element 25 and preloads applied pressure roller retaining element 23 against applied pressure roller 20, and thus applied pressure roller 20 itself against X friction rod 10 with an applied pressure force.

On the motor shaft 19 side, two closely adjacent load relief bearings 27 are arranged on a load relief bearing retaining element 26. Load relief bearing retaining element 26 is limitedly movable with respect to motor mount 22. A compensation spring 28 is arranged on a compensation spring retaining element 29, and preloads the two load relief bearings 27 on load relief bearing retaining element 26 against motor shaft 19 with a compensation force.

This compensation force is directed oppositely to the applied pressure force exerted by applied pressure roller 20, and compensates for the applied pressure force. The load on motor shaft 19 is thereby relieved. At the same time, it is possible to act on Y friction rod 10 with very high applied pressure forces and thereby to move the very heavy components of the coordinate measuring stage. The gap between the two load relief bearings 26 forms a V-shaped receptacle for motor shaft 19, which is centered against motor shaft 19 by the movability of load relief bearing retaining element 26 and by the applied pressure force itself.

Since the motion of Y friction rod 12 is transferred to a push bar 17 by means of an annular air bearing 16 (details have already been explained with reference to FIG. 1), lateral motions of the free end of Y friction rod 12 would result in tilting of annular air bearing 16 on push bar 17 and thus in positioning inaccuracies. Applied pressure roller 20 is therefore not arranged directly opposite motor shaft 19, but exhibits a lateral offset relative to the position of motor shaft 19 on Y friction rod 12.

A support bearing 30, which stabilizes Y friction rod 12 and exhibits an even greater lateral offset in the direction of the aforesaid lateral offset of applied pressure roller 20, is additionally arranged, at a distance from the load relief bearings, on the side of Y friction rod 12 against which motor shaft 19 is in contact. The free end of Y friction rod 12 is thereby stabilized by support bearing 30, so that tilting of annular air bearing 16 on push bar 17 is no longer possible.

Figure 4:
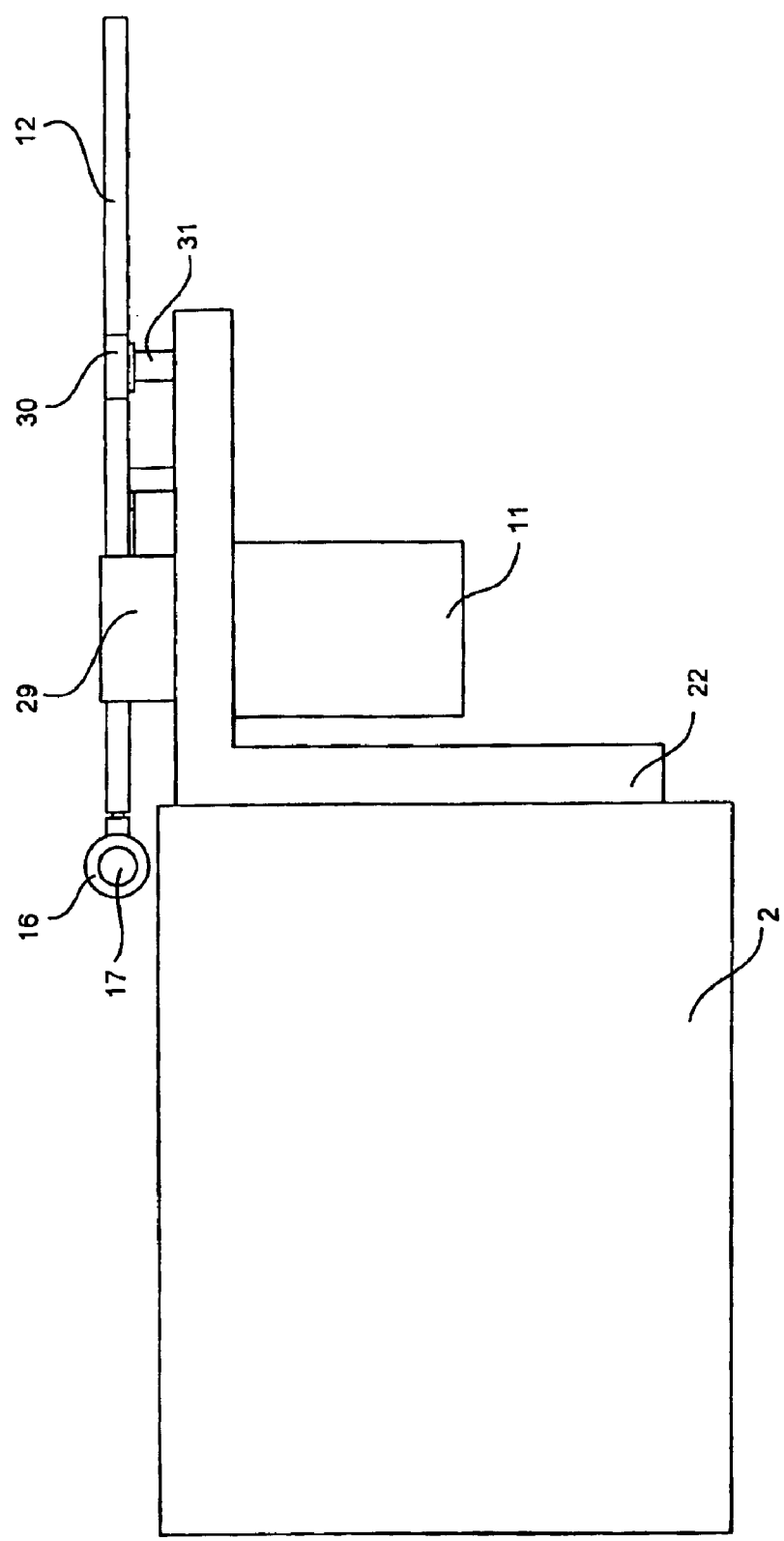
FIG. 4 is a detail view, from the side, of the Y drive of the coordinate measuring stage of FIG. 1.

FIG. 4 is a detail view, from the side, of the Y drive of the coordinate measuring stage of FIG. 3. The same components as in FIG. 3 are shown, if not concealed by the manner of illustration.

Motor mount 22 is attached to base part 2 which can be made, for example, of granite. A Y drive element 11 is arranged on motor mount 22. Motor shaft 19 (concealed in the illustration) of Y drive element 11 projects upward through motor mount 22 and is in contact against Y friction rod 12. Applied pressure roller 20 on applied pressure roller retaining element 23 is concealed in the illustration. Compensation spring retaining element 29, on which compensation spring 28 (concealed in the illustration) is arranged, is visible. The motion of Y friction rod 12 is transferred by means of annular air bearing 16 to a push bar 17 (details have already been explained with reference to FIG. 1).

In order to suppress lateral motions of the free end of Y friction rod 12, which would result in tilting of annular air bearing 16 on push bar 17 and therefore in positioning inaccuracies, support bearing 30 is additionally arranged on a support bearing retaining element 31 on the side of Y friction rod 12 against which motor shaft 19 is in contact. This bearing exhibits a greater lateral offset with respect to the motor shaft (details have already been explained with reference to FIG. 3).

PARTS LIST

1 Coordinate measuring stage
2 Base part
3 X guidance element
4 Middle part
5 Stage body
6 Y guidance element
7 Support air bearing
8 Guidance air bearing
9 X drive element
10 X friction rod
11 Y drive element
12 Y friction rod
13 Additional support element
14 Retaining elements
15 Y guide rib
16 Annular air bearing
17 Push bar
18 Internally located opening
19 Motor shaft
20 Applied pressure roller
21 Compensation means
22 Motor mount
23 Applied pressure roller retaining element
24 Applied pressure spring
25 Applied pressure spring retaining element
26 Load relief bearing retaining element
27 Load relief bearing
28 Compensation spring
29 Compensation spring retaining element
30 Support bearing
31 Support bearing retaining element

What is claimed is:

1. An XY coordinate measuring stage comprising:
   a drive unit for a coordinate axis, the drive unit including
   a friction rod and a motor, the motor including a motor shaft, the motor shaft being in contact with a first side of the friction rod;
   an applied pressure roller contacting a second side of the friction rod;
   at least one applied pressure spring configured to urge the applied pressure roller, the friction rod, and the motor shaft against one another with an applied pressure force so that the motor shaft frictionally engages the friction rod so as to convert a rotational motion of the motor into a linear motion of the friction rod; and a compensation device associated with the motor shaft, the compensation device being configured to generate a compensation force against the motor shaft oppositely to the applied pressure force so as to at least partially compensate for the applied pressure force.

2. The XY coordinate measuring stage as recited in claim 1 wherein the applied pressure roller is disposed on an applied pressure roller retaining element, the applied pressure roller retaining element being preloaded with the applied pressure force against the friction rod.

3. The XY coordinate measuring stage as recited in claim 2 wherein:

the compensation device includes two closely adjacent load relief bearings disposed on a limitedly movable load relief bearing retaining element, the load relief bearings being preloaded with the compensation force against the motor shaft, a gap between the two load relief bearings defining a V-shaped receptacle for the motor shaft, the movability of the load relief bearing retaining element and the applied pressure force enabling the V-shaped receptacle to center itself against the motor shaft due to; and the motor is disposed on a substantially immovable motor mount.

4. The XY coordinate measuring stage as recited in claim 3 wherein the load relief bearings include at least one of a ball bearing, a self-aligning ball bearing and a needle bearing.

5. The XY coordinate measuring stage as recited in claim 3 wherein the applied pressure roller is disposed with a lateral offset relative to a position of the motor shaft on the friction rod and further comprising a support bearing configured to stabilize the friction rod, the support bearing being disposed on the first side of the friction rod at a distance from the load relief bearings with a lateral offset greater than the lateral offset of the applied pressure roller in a same direction as the lateral offset of the applied pressure roller.

6. The XY coordinate measuring stage as recited in claim 1 wherein the applied pressure roller includes at least one of a ball bearing, a self-aligning ball bearing and a needle bearing.

7. The XY coordinate measuring stage as recited in claim 1 wherein the motor includes at least one of a stepping motor and a DC motor.

8. The XY coordinate measuring stage as recited in claim 1 wherein the motor includes a torque motor.

* * * * *